US010672774B2

(12) United States Patent
Chen et al.

(10) Patent No.: US 10,672,774 B2
(45) Date of Patent: Jun. 2, 2020

(54) BIT LINE GATE STRUCTURE OF DYNAMIC RANDOM ACCESS MEMORY (DRAM) AND FORMING METHOD THEREOF

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Yi-Wei Chen, Taichung (TW); Pin-Hong Chen, Tainan (TW); Tsun-Min Cheng, Changhua County (TW); Chun-Chieh Chiu, Keelung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/900,800

(22) Filed: Feb. 21, 2018

(65) Prior Publication Data

US 2019/0252390 A1 Aug. 15, 2019

(30) Foreign Application Priority Data

Feb. 12, 2018 (CN) .......................... 2018 1 0145119

(51) Int. Cl.
*H01L 27/108* (2006.01)
*H01L 21/285* (2006.01)
*H01L 21/3215* (2006.01)
*H01L 23/532* (2006.01)

(52) U.S. Cl.
CPC .. *H01L 27/10888* (2013.01); *H01L 21/28568* (2013.01); *H01L 21/32155* (2013.01); *H01L 23/53266* (2013.01); *H01L 23/53271* (2013.01); *H01L 27/10823* (2013.01); *H01L 27/10885* (2013.01)

(58) Field of Classification Search
CPC ......... H01L 27/10888; H01L 27/10885; H01L 27/10823; H01L 23/53271; H01L 23/53266; H01L 23/32155; H01L 23/28568

See application file for complete search history.

(56) References Cited

U.S. PATENT DOCUMENTS

| 6,653,181 B2* | 11/2003 | Hergenrother .... H01L 21/82388 257/E21.643 |
| 8,969,936 B2 | 3/2015 | Lee |
| 9,773,789 B1 | 9/2017 | Chen |

(Continued)

*Primary Examiner* — Hoa B Trinh
(74) *Attorney, Agent, or Firm* — Winston Hsu

(57) ABSTRACT

A method of forming a bit line gate structure of a dynamic random access memory (DRAM) includes the following steps. A polysilicon layer is formed on a substrate. A sacrificial layer is formed on the polysilicon layer. An implantation process is performed on the sacrificial layer and the polysilicon layer. The sacrificial layer is removed. A metal stack is formed on the polysilicon layer. The present invention also provides another method of forming a bit line gate structure of a dynamic random access memory (DRAM) including the following steps. A polysilicon layer is formed on a substrate. A plasma doping process is performed on a surface of the polysilicon layer. A metal stack is formed on the surface of the polysilicon layer.

11 Claims, 5 Drawing Sheets

(56) References Cited

U.S. PATENT DOCUMENTS

| | | | | |
|---|---|---|---|---|
| 2003/0230783 | A1* | 12/2003 | Willer | H01L 27/115 257/390 |
| 2014/0001576 | A1* | 1/2014 | Gandikota | H01L 21/28061 257/412 |
| 2014/0264548 | A1* | 9/2014 | Lee | H01L 27/11551 257/324 |
| 2015/0155163 | A1* | 6/2015 | Kim | H01L 21/02274 257/296 |
| 2015/0214478 | A1* | 7/2015 | Lee | H01L 45/1233 257/5 |
| 2015/0311433 | A1* | 10/2015 | Bae | H01L 43/12 438/3 |
| 2015/0333148 | A1* | 11/2015 | Koo | H01L 29/66545 257/288 |
| 2016/0035676 | A1* | 2/2016 | Im | H01L 27/10855 257/306 |
| 2016/0181143 | A1* | 6/2016 | Kwon | H01L 27/1052 438/586 |
| 2017/0018552 | A1* | 1/2017 | Moon | H01L 27/10897 |

\* cited by examiner

BIT LINE GATE STRUCTURE OF DYNAMIC RANDOM ACCESS MEMORY (DRAM) AND FORMING METHOD THEREOF

BACKGROUND OF THE INVENTION

1. Field of the Invention

The present invention relates generally to a dynamic random access memory (DRAM) and forming method thereof, and more specifically to a bit line gate structure of a dynamic random access memory (DRAM) and forming method thereof.

2. Description of the Prior Art

Random access memory (RAM) can be operated to read data from it and write data into it. As computers containing RAM turn off, data disappears from the RAM immediately. Since data in RAM can be altered easily, RAM is widely used as temporary data storage memory in personal computers. RAM can be classified into dynamic-type and static-type.

A static random access memory (SRAM: Static RAM) stores one-bit data by six transistors, and electricity is not needed during operating to keep this data, thus called Static RAM. Static RAM is a complex structure, therefore having high access speed and high cost, thereby it is often used as a memory providing low capacity but high speed such as a 256 KB or 512 KB cache memory built-in a central processing unit (CPU) of a personal computer.

A dynamic random access memory (DRAM: Dynamic RAM) stores one-bit data by one transistor paired with one capacitor, and electricity must be supported during operating to keep this data, thus called Dynamic RAM. Dynamic RAM is a simple structure, therefore having slow access speed and low cost. Thus, it is often used as a memory providing high capacity but low speed such as a main memory of a personal computer.

SUMMARY OF THE INVENTION

The present invention provides a bit line gate structure of a dynamic random access memory (DRAM) and forming method thereof, which has the maximum implanting concentration of a polysilicon layer of the bit line gate structure at an interface of the polysilicon layer and a metal stack to reduce contact resistance.

The present invention provides a method of forming a bit line gate structure of a dynamic random access memory (DRAM) including the following steps. A polysilicon layer is formed on a substrate. A sacrificial layer is formed on the polysilicon layer. An implantation process is performed on the sacrificial layer and the polysilicon layer. The sacrificial layer is removed. A metal stack is formed on the polysilicon layer.

The present invention provides a method of forming a bit line gate structure of a dynamic random access memory (DRAM) including the following steps. A polysilicon layer is formed on a substrate. A plasma doping process is performed on a surface of the polysilicon layer. A metal stack is formed on the surface of the polysilicon layer.

The present invention provides a bit line gate structure of a dynamic random access memory (DRAM) including a polysilicon layer and a metal stack. The polysilicon layer is disposed on a substrate. The metal stack is disposed on the polysilicon layer, wherein the maximum dopant concentration of the polysilicon layer is at an interface of the polysilicon layer and the metal stack.

According to the above, the present invention provides a bit line gate structure of a dynamic random access memory (DRAM) and forming method thereof, which forms a sacrificial layer on a polysilicon layer, performing an implantation process on the sacrificial layer and the polysilicon layer, and removing the sacrificial layer; or, performing a plasma doping process directly on a surface of the polysilicon layer, thereafter forming a metal stack on the polysilicon layer. In this way, the maximum implanting concentration of the polysilicon layer is at a surface of the polysilicon layer (meaning the maximum implanting concentration of the polysilicon layer is at an interface of the metal stack and the polysilicon layer), and the implanting concentration of the polysilicon layer decreases gradiently from the interface of the metal stack and the polysilicon layer. Therefore, the contact resistance of the interface of the metal stack and the polysilicon layer is reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
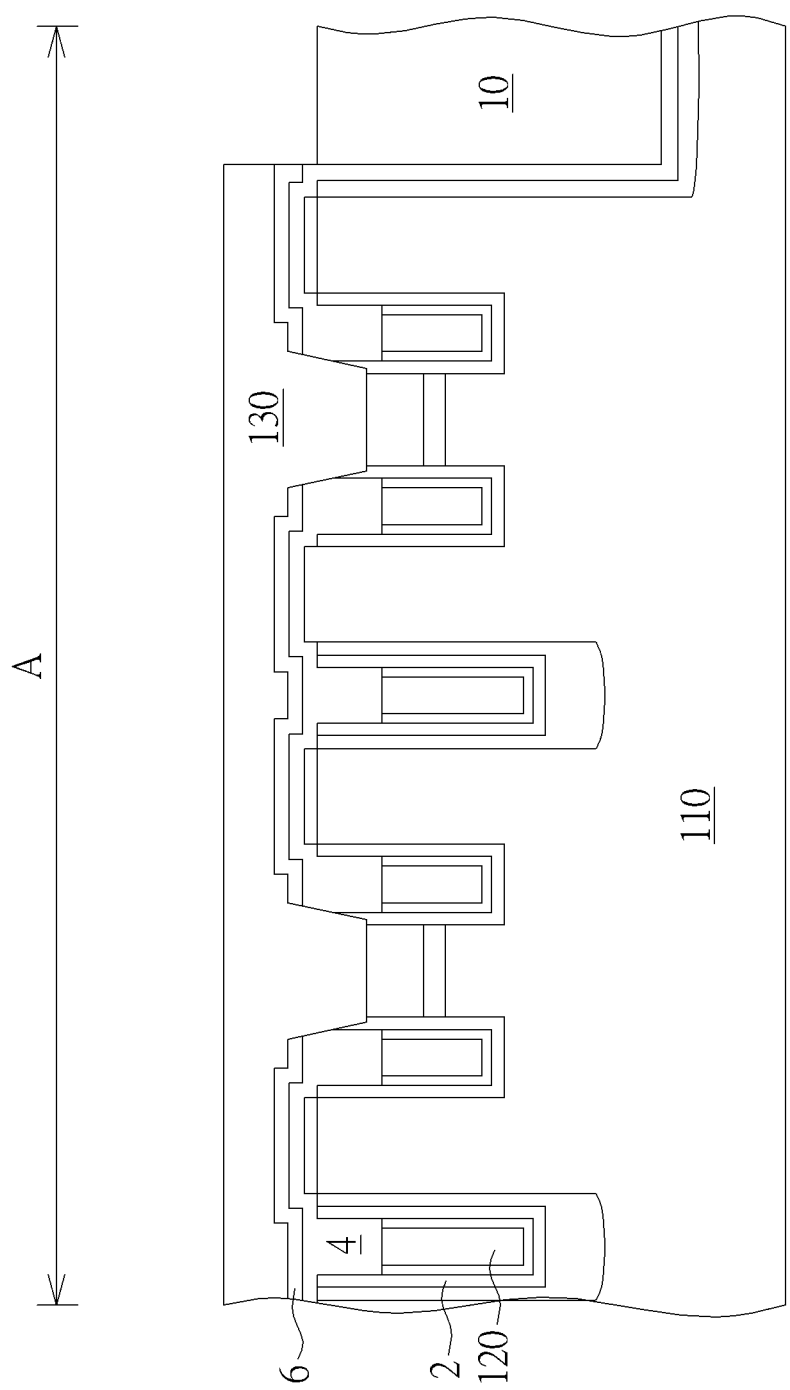
FIG. 1 schematically depicts a cross-sectional view of a method of forming a bit line gate structure of a dynamic random access memory (DRAM) according to an embodiment of the present invention.

FIG. 1 schematically depicts a cross-sectional view of a method of forming a bit line gate structure of a dynamic random access memory (DRAM) according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. There is only one memory area A depicted in the figure, the memory area A may connect to other areas (not shown) such as a logic area, and a shallow trench isolation (STI) 10 isolates the memory area A from other areas, but it is not limited thereto. A dynamic random access memory including recessed gates may be formed in the memory area A while MOS transistors operating the dynamic random access memory may be formed in the logic area.

A plurality of embedded gate structures 120 are disposed in the substrate 110 of the memory area A. The shallow trench isolation (STI) 10 and the isolation materials covering the substrate 110 of the memory area A may include a silicon oxide layer 2, a silicon nitride layer 4 and a silicon oxide layer 6 and etc, but it is not limited thereto. A polysilicon layer 130 is formed on the substrate 110 of the memory area A and covers the embedded gate structures 120 in the substrate 110.

Then, methods of FIGS. 2-3 or FIGS. 4-5 may be applied to form a metal stack on the polysilicon layer 130, wherein the maximum implanting concentration of the polysilicon layer 130 is at an interface of the polysilicon layer 130 and the metal stack.

Figure 2:
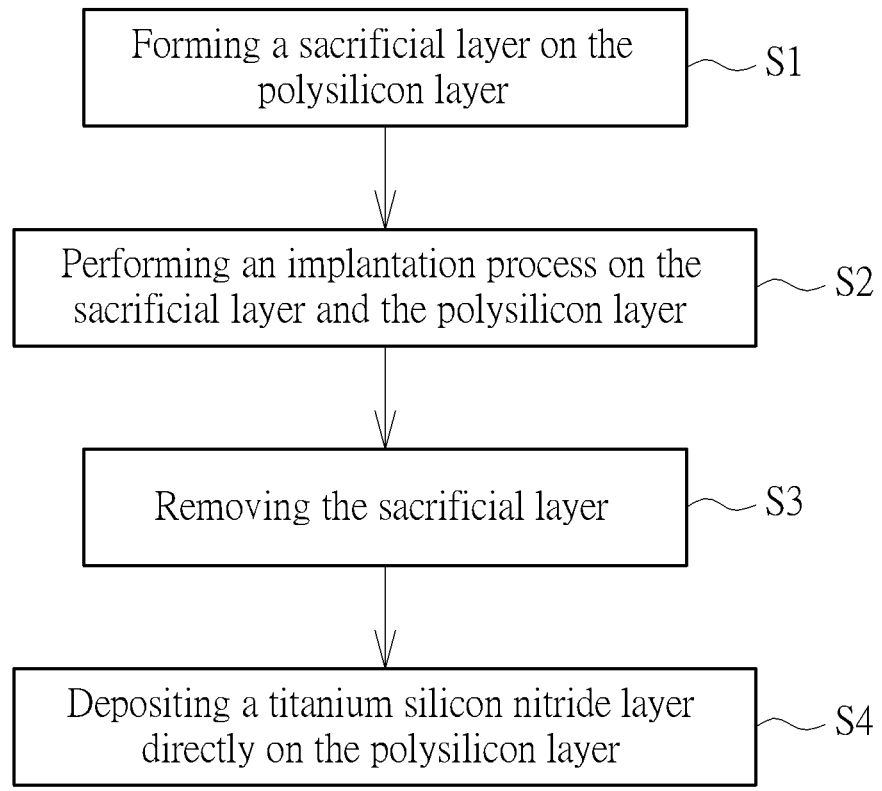
FIG. 2 schematically depicts a flow chart of a method of forming a bit line gate structure of a dynamic random access memory (DRAM) according to an embodiment of the present invention.
Figure 3:
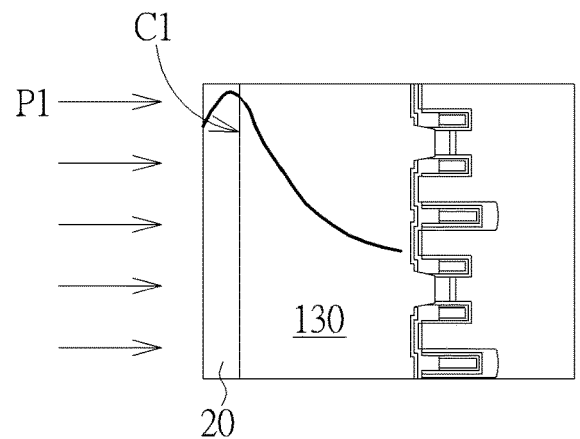
FIG. 3 schematically depicts a cross-sectional view of the method of forming a bit line gate structure of a dynamic random access memory (DRAM) of FIG. 2.
Figure 3:
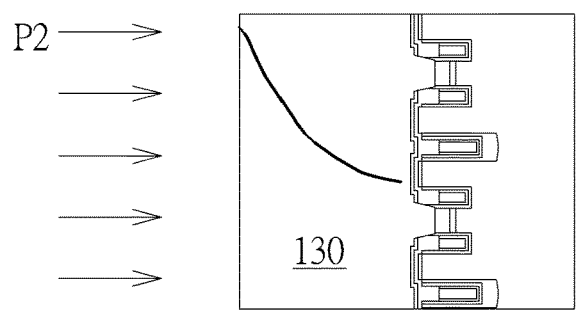
Figure 3:
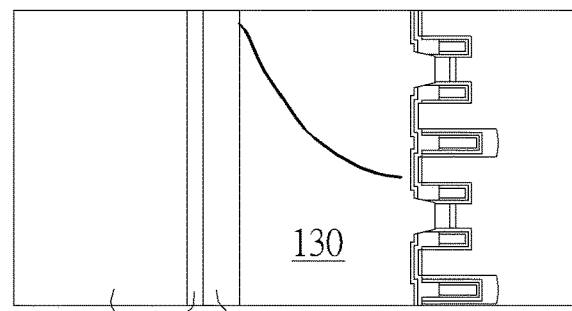
Figure 3:
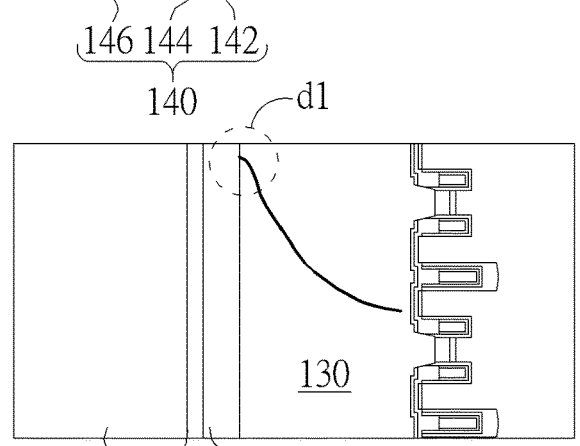

FIG. 2 schematically depicts a flowchart of a method of forming a bit line gate structure of a dynamic random access memory (DRAM) according to an embodiment of the present invention. FIG. 3 schematically depicts a cross-sectional view of the method of forming a bit line gate structure of a dynamic random access memory (DRAM) of FIG. 2. Please refer to FIGS. 2-3 at the same time. According to Step S1 and FIG. 3(a): forming a sacrificial layer on the polysilicon layer, the sacrificial layer 20 is formed on the polysilicon layer 130. The sacrificial layer 20 may be an oxide layer, a nitride layer or other dielectric layers. In this embodiment, the sacrificial layer 20 is an oxide layer. According to Step S2 and FIG. 3(a)—performing an implantation process on the sacrificial layer and the polysilicon layer, an implantation process P1 is performed on the sacrificial layer 20 and the polysilicon layer 130. By applying the implantation process P1, the maximum implanting concentration of the polysilicon layer 130 is on a surface C1 of the polysilicon layer 130. The implant of the implantation process P1 may be phosphorus or arsenic, but it is not limited thereto. In a preferred embodiment, the maximum implanting concentration of the polysilicon layer 130 and the sacrificial layer 20 by performing the implantation process P1 is at an interface (surface C1) of the polysilicon layer 130 and the sacrificial layer 20, but it is not limited thereto. In another embodiment, the maximum implanting concentration of the polysilicon layer 130 and the sacrificial layer 20 is in the sacrificial layer 20. It is emphasized that, the maximum implanting concentration of the polysilicon layer 130 is at the surface C1 of the polysilicon layer 130. In other words, as the maximum implanting concentration of the polysilicon layer 130 and the sacrificial layer 20 is at an interface (surface C1) of the polysilicon layer 130 and the sacrificial layer 20 or the maximum implanting concentration of the polysilicon layer 130 and the sacrificial layer 20 is in the sacrificial layer 20, the maximum implanting concentration of the polysilicon layer 130 can be at the surface C1 of the polysilicon layer 130 while the implanting concentration of the polysilicon layer 130 decreases gradiently from the surface C1. According to Step S3 and FIG. 3(b)—removing the sacrificial layer, the sacrificial layer 20 is removed. In this embodiment, methods of removing the sacrificial layer 20 may include a wet cleaning process P2, but it is not limited thereto. According to Step S4 and FIG. 3(c)—depositing a titanium silicon nitride layer directly on the polysilicon layer, the titanium silicon nitride layer 142 is deposited directly on the polysilicon layer 130. Methods of depositing a titanium silicon nitride layer 142 directly on the polysilicon layer 130 may include an atomic layer deposition process, but it is not limited thereto. As shown in FIG. 3(c), the titanium silicon nitride layer 142, a tungsten silicon layer 144 and a tungsten layer 146 may be deposited from bottom to top sequentially, wherein the titanium silicon nitride layer 142, the tungsten silicon layer 144 and the tungsten layer 146 constitute a metal stack 140.

The titanium silicon nitride layer 142 of the present invention can replace a stacked layer including a titanium silicon layer and titanium/titanium nitride layer that is widely used in nowadays industry, thereby the thickness of the bit line gate structure can be reduced. Besides, the maximum implanting concentration of the polysilicon layer 130 is at an interface (surface C1) of the polysilicon layer 130 and the metal stack 140, therefore the contact resistance of the interface (surface C1) of the polysilicon layer 130 and the metal stack 140 being reduced. In a preferred embodiment, the ratio of dopant to silicon of the polysilicon layer 130 at the surface C1 is at a range of 0.1%~10%. In a still preferred embodiment, the maximum implanting concentration of the polysilicon layer 130 is at a range of $1\times10^{19}/cm^3 \sim 1\times10^{22}/cm^3$, but it is not limited thereto.

As shown in FIG. 3(d), an annealing process is optionally performed, therefore the interface (surface C1) of the titanium silicon nitride layer 142 and the polysilicon layer 130 has a smooth distribution of an implanting concentration d1. The annealing process may be a rapid thermal processing (RTP) process, but it is not limited thereto.

Figure 4:
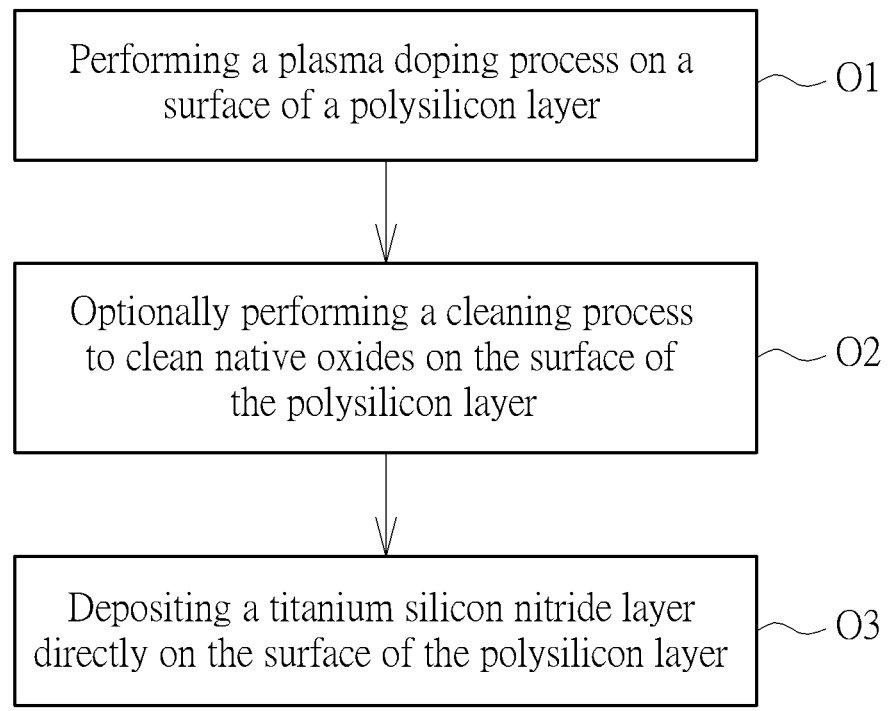
FIG. 4 schematically depicts a flow chart of a method of forming a bit line gate structure of a dynamic random access memory (DRAM) according to another embodiment of the present invention.
Figure 5:
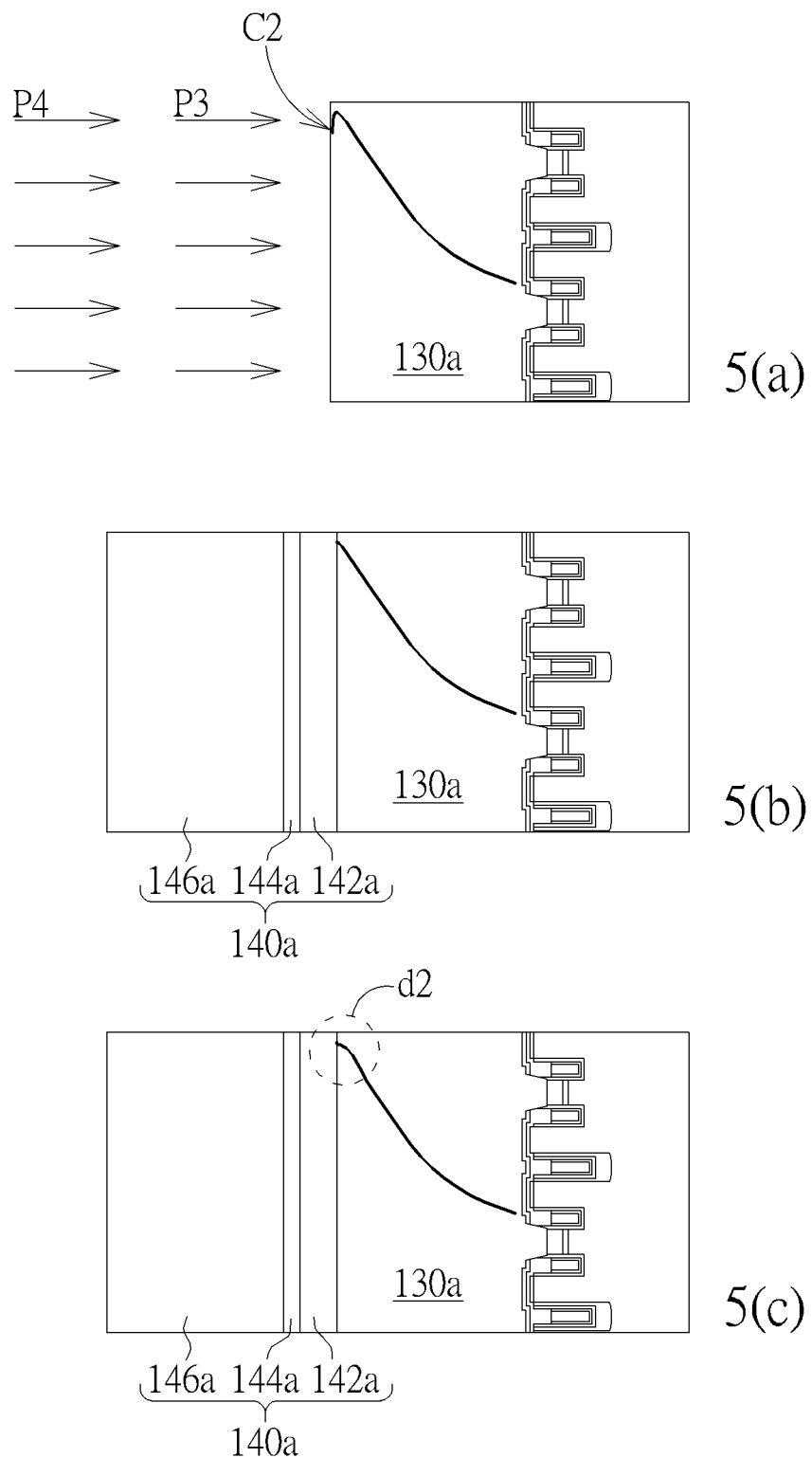
FIG. 5 schematically depicts a cross-sectional view of the method of forming a bit line gate structure of a dynamic random access memory (DRAM) of FIG. 4.

Otherwise, the methods of FIGS. 4-5 for forming a metal stack on the polysilicon layer may be processed, thereby the maximum implanting concentration of the polysilicon layer can be at an interface of the polysilicon layer and metal stack.

FIG. 4 schematically depicts a flowchart of a method of forming a bit line gate structure of a dynamic random access memory (DRAM) according to another embodiment of the present invention. FIG. 5 schematically depicts a cross-sectional view of the method of forming a bit line gate structure of a dynamic random access memory (DRAM) of FIG. 4. Please refer to FIGS. 4-5. According to Step O1 and FIG. 5(a)—performing a plasma doping process on a surface of a polysilicon layer, a plasma doping process P3 is performed on a surface C2 of a polysilicon layer 130a. Due to the plasma doping process P3 is used in this embodiment, the maximum implanting concentration of the polysilicon layer 130a is at the surface C2 of the polysilicon layer 130a, and the implanting concentration of the polysilicon layer 130a decreases gradiently. The implant of the implantation process P3 may be phosphorus or arsenic, but it is not limited thereto. According to Step O2 and FIG. 5(a)—optionally performing a cleaning process to clean native oxides on the surface of the polysilicon layer, a cleaning process P4 is optionally performed to clean native oxides on the surface C2 of the polysilicon layer 130a. In this embodiment, the cleaning process P4 is a wet cleaning process, but it is not limited thereto. According to Step O3 and FIG. 5(b)—depositing a titanium silicon nitride layer directly on the surface of the polysilicon layer, a titanium silicon nitride layer 142a is deposited directly on the surface C2 of the polysilicon layer 130a. Methods of depositing the titanium silicon nitride layer 142a directly on the surface C2 of the polysilicon layer 130a may include an atomic layer deposition process, but it is not limited thereto. As shown in FIG. 5(b), the titanium silicon nitride layer 142a, a tungsten silicon layer 144a and a tungsten layer 146a may be deposited from bottom to top sequentially, wherein the titanium silicon nitride layer 142a, the tungsten silicon layer 144a and the tungsten layer 146a constitute a metal stack 140a.

The titanium silicon nitride layer 142a of the present invention can replace a stacked layer including a titanium silicon layer and a titanium/titanium nitride layer that is widely used in nowadays industry, thereby the thickness of the bit line gate structure can be reduced. Besides, the maximum implanting concentration of the polysilicon layer 130a is at the surface C2 of the polysilicon layer 130a, therefore the contact resistance of the interface (surface C2) of the polysilicon layer 130a and the metal stack 140a being reduced. In a preferred embodiment, the ratio of dopant to silicon of the polysilicon layer 130a at the surface C2 is at a range of 0.1%~10%. In a still preferred embodiment, the maximum implanting concentration of the polysilicon layer 130a is at a range of $1\times10^{19}/cm^3 \sim 1\times10^{22}/cm^3$, but it is not limited thereto.

As shown in FIG. 5(c), an annealing process is optionally performed, therefore the interface (surface C2) of the titanium silicon nitride layer 142a and the polysilicon layer 130a has a smooth distribution of an implanting concentration d2. The annealing process may be a rapid thermal processing (RTP) process, but it is not limited thereto. Thereafter, later processes for forming a dynamic random access memory (DRAM) may be performed. These processes are not described.

To summarize, the present invention provides a bit line gate structure of a dynamic random access memory (DRAM) and forming method thereof, which forms a sacrificial layer on a polysilicon layer, performing an implantation process on the sacrificial layer and the polysilicon layer, and removing the sacrificial layer; or, performing a plasma doping process on a surface of the polysilicon layer, thereafter forming a metal stack on the polysilicon layer. In this way, the maximum implanting concentration of the polysilicon layer is at a surface of the polysilicon layer (meaning the maximum implanting concentration of the polysilicon layer is at an interface of the metal stack and the polysilicon layer), and the implanting concentration of the polysilicon layer decreases gradiently from the interface of the metal stack and the polysilicon layer. Therefore, the contact resistance of the interface of the metal stack and the polysilicon layer is reduced.

Moreover, the metal stack may include a titanium silicon nitride layer, and the titanium silicon nitride layer is deposited on the surface of the polysilicon layer directly, so that a stacked layer including a titanium silicon layer and a titanium/titanium nitride layer that is widely used in nowadays industry is replaced, thereby the thickness of the bit line gate structure can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a bit line gate structure of a dynamic random access memory (DRAM), comprising: forming a polysilicon layer on a substrate; forming a sacrificial layer on the polysilicon layer; performing an implantation process on the sacrificial layer and the polysilicon layer, wherein the maximum implanting concentration of the polysilicon layer and the sacrificial layer implanted by the implantation process is at an interface of the polysilicon layer and the sacrificial layer; removing the sacrificial layer; and forming a metal stack on the polysilicon layer, wherein the step of forming the metal stack on the polysilicon layer comprises depositing a titanium silicon nitride layer directly on the polysilicon layer.

2. The method of forming a bit line gate structure of a dynamic random access memory (DRAM) according to claim 1, wherein the sacrificial layer comprises an oxide layer or a nitride layer.

3. The method of forming a bit line gate structure of a dynamic random access memory (DRAM) according to claim 1, wherein the maximum implanting concentration of the polysilicon layer and the sacrificial layer implanted by the implantation process is in the sacrificial layer.

4. The method of forming a bit line gate structure of a dynamic random access memory (DRAM) according to claim 1, wherein the implant of the implantation process comprises phosphorus or arsenic.

5. The method of forming a bit line gate structure of a dynamic random access memory (DRAM) according to claim 1, wherein the sacrificial layer is removed by a wet cleaning process.

6. The method of forming a bit line gate structure of a dynamic random access memory (DRAM) according to claim 1, wherein the titanium silicon nitride layer is deposited by an atomic layer deposition (ALD) process.

7. A method of forming a bit line gate structure of a dynamic random access memory (DRAM), comprising: forming a polysilicon layer on a substrate; performing a plasma doping process on a surface of the polysilicon layer; performing a wet cleaning process to dean native oxides on the surface of the polysilicon layer; and forming a metal stack on the surface of the polysilicon layer, wherein the metal stack comprises a titanium silicon nitride layer, a tungsten silicon layer and a tungsten layer stacked from bottom to top.

8. The method of forming a bit line gate structure of a dynamic random access memory (DRAM) according to claim 7, wherein the maximum doping concentration of the polysilicon layer is at the surface of the polysilicon layer.

9. The method of forming a bit line gate structure of a dynamic random access memory (DRAM) according to claim 7, wherein dopant of the plasma doping process comprises phosphorus or arsenic.

10. The method of forming a bit line gate structure of a dynamic random access memory (DRAM) according to claim 7, wherein the step of forming the metal stack on the surface of the polysilicon layer comprises depositing the titanium silicon nitride layer directly on the surface of the polysilicon layer.

11. The method of forming a bit line gate structure of a dynamic random access memory (DRAM) according to claim 10, wherein the titanium silicon nitride layer is deposited by an atomic layer deposition (ALD) process.

* * * * *